United States Patent [19]
Voeten et al.

[11] Patent Number: 5,553,005
[45] Date of Patent: Sep. 3, 1996

[54] VIDEO SERVER MEMORY MANAGEMENT METHOD

[75] Inventors: Bart F. Voeten, Beerse; Christophe D. G. Vermeulen, Ramegnies-Chin; Frank O. Van der Putten, Lede; Frank C. M. Defoort, Aartselaar, all of Belgium

[73] Assignee: Alcatel N.V., Rijswijk, Netherlands

[21] Appl. No.: 246,182

[22] Filed: May 19, 1994

[30] Foreign Application Priority Data

May 19, 1993 [EP] European Pat. Off. ............. 93870086

[51] Int. Cl.⁶ ............................................. G11B 5/02
[52] U.S. Cl. .................. 364/514 R; 395/431; 360/19.1
[58] Field of Search ........................ 364/514; 395/325, 395/425, 600, 275, 400, 153, 164, 165; 348/13, 6, 7; 345/202; 360/19.1

[56] References Cited

U.S. PATENT DOCUMENTS

| | | | |
|---|---|---|---|
| 4,734,764 | 3/1988 | Pocock et al. | 358/86 |
| 4,797,755 | 1/1989 | Baldwin et al. | |
| 4,878,183 | 10/1989 | Ewart | 364/521 |
| 5,014,125 | 5/1991 | Pocock et al. | 358/86 |
| 5,109,348 | 4/1992 | Pfeiffer et al. | 395/164 |
| 5,161,221 | 11/1992 | Van Nostrand | |
| 5,214,639 | 5/1993 | Henrion | |
| 5,262,875 | 11/1993 | Mincer et al. | 358/335 |
| 5,305,438 | 4/1994 | MacKay et al. | 395/164 |
| 5,333,277 | 7/1994 | Searls | 395/325 |
| 5,351,129 | 9/1994 | Lai | 348/584 |
| 5,359,365 | 10/1994 | Enokida | 348/390 |
| 5,396,339 | 3/1995 | Stern et al. | 358/342 |
| 5,414,455 | 5/1995 | Hooper et al. | 348/7 |
| 5,440,336 | 8/1995 | Buhro et al. | 348/13 |
| 5,442,390 | 8/1995 | Hooper et al. | 348/7 |
| 5,451,982 | 9/1995 | Stern et al. | 345/127 |

FOREIGN PATENT DOCUMENTS

| | | |
|---|---|---|
| 0446493 | 9/1991 | European Pat. Off. |
| 0544975 | 12/1991 | European Pat. Off. |
| 0529864 | 3/1993 | European Pat. Off. |
| 3633165 | 4/1987 | Germany |
| 2248322 | 4/1992 | United Kingdom |
| 9007184 | 6/1990 | WIPO |
| 9102420 | 2/1991 | WIPO |
| 9211713 | 7/1994 | WIPO |

OTHER PUBLICATIONS

Chang et al., "Scalable Video Data Placement on Parallel Disk Arrays", Conference Date Feb. 7, 1994.

Chang et al., "Variable Bit Rate MPEG Video Storage on Parallel Disk Arrays", Conference Date Jul. 13, 1994.

"Design & Modeling of Clustered RAID", Merchant et al., 1992.

"RAID-II: A High-Bandwidth Network File Server", Drapeau et al., Jul. 1994.

(List continued on next page.)

Primary Examiner—Emanuel T. Voeltz
Assistant Examiner—Patrick Assouad
Attorney, Agent, or Firm—Ware, Fressola, Van Der Sluys & Adolphson

[57] ABSTRACT

The present invention relates to a video server memory management for a video server transmitting video signals (VS) to user stations in response to control signals issued by these stations. This method includes the steps of providing a memory constituted by a plurality of random access memories (HD1/ . . . /HD4) and subdividing each of said video signals in a plurality of distinct blocks (BL1/ . . . /BLQ) each typically corresponding to less than a second of the video signal. It is further proposed to include in this method the step of storing any two blocks (BL1/ . . . /BLQ) which normally are to be consecutively retrieved from the memory in distinct random access memories (HD1/ . . . /HD4). In this way the full interactive video on demand service, giving the user stations control over the way in which the blocks are retrieved from the memory, is improved as is the rate at which a predetermined sequence of blocks is retrieved from the memory.

2 Claims, 3 Drawing Sheets

OTHER PUBLICATIONS

"Application of the Multipath Self-Routing Switch in a Combined STM/ATM Cross-Connect System", B. Pauwels et al, *ISS* '92, Yokohama, pp. 1–13.

"Hierarchical Distribution of Video with Dynamic Port Allocation", T. Yum, *IEEE Transactions on Communications*, vol. 39, No. 8, Aug. 1991, pp. 1268–1274.

"Architectural Design of On-Demand Video Delivery Systems: The Spatio-Temporal Storage Allocation Problem", R. Ramarao et al, ICC '91, Jun. 1991, Denver, pp. 506–510.

"A Store-and-Forward Architecture for Video-on-Demand Service", A. Gelman et al, *ICC* '91, Jun. 1991, Denver, pp. 842–846.

"DataMesh—Parallel Storage Systems for the 1990's", J. Wilkes, *11th IEEE Symposium on Mass Storage Systems*, Oct. 1991, Monterey CA, pp. 131–136.

"System architecture for a large scale video on demand service", W. Sincoskie, *Computer Networks and ISDN Systems* 22, (1991), pp. 155–162.

"A Multi-ported Memory Array Optimized for Sequential Transfers", Anonymous, Research Disclosure 330, Emsworth, GB, Oct. 1991, p. 813.

"Strength (and Safety) in Numbers", M. Anderson, *BYTE*, vol. 13, No. 15, Dec. 1990, pp. 337–339.

"Maximizing Performance in a Striped Disk Array", P. Chen et al, *IEEE 17th Annual Int'l Symposium on Computer Architecture, Proceedings*, May 28, 1990, Seattle, pp. 322–331.

VIDEO SERVER MEMORY MANAGEMENT METHOD

TECHNICAL FIELD

The present invention relates to a video server memory management method including the steps of providing a memory constituted by a plurality of random access memories each having a single output for retrieving data stored therein, subdividing each of said video signals in a plurality of distinct blocks corresponding to successive parts of said video signal, storing at least two of said blocks in each of said random access memories, and, retrieving said blocks from said random access memories in a predetermined sequence.

BACKGROUND OF THE INVENTION

Such a video server memory management method is known in the art, e.g. from the article "System architecture for a large scale video on demand service" by W. Sincoskie, Computer Networks and ISDN Systems 22, 1991, pp. 155–162, and more particularly from the "NTSC case" discussed in the 2nd paragraph of section 4.1 thereof.

Attention is drawn to the fact that in this article the blocks do not correspond to the above defined blocks as they do not correspond to successive parts of the video signal while on the other hand the above defined blocks are referred to as frames. Also, in the article each of the random access memories corresponds to the memory associated to one of the "parallel heads" as this memory has a single output, i.e. the parallel heads, as mentioned above.

According to this known memory management method a large number of blocks, each corresponding to part of the video signal and together constituting a portion of the video signal, e.g. of 12.5 minutes, are stored in a single random access memory and distinct portions of this video signal are stored in distinct random access memories. Within each of the random access memories use is made of a block interleaving scheme which defines the above mentioned predetermined sequence and permits the optimization of the retrieval rate of a large number of so called predetermined "phases" of a same video signal.

As explained in the article, this management method is optimized for offering a rough video on demand service to user stations coupled to the video server and accepting a limited interactive control, while user stations requesting full interactive control, e.g., VCR functionalities such as fast forward and rewind, are serviced via intermediate stopstart buffers allocated to them.

In other words, full interactive control is with the known method only supported by continuous production of a large number of "phases" of a same video signal and by the use of additional hardware. Although this method is very well suited for some popular video signals, since the continuous production of a large number of "phases" is then justified, for other video signals it is advantageous to allow the user stations to have direct interactive control of the retrieval of video signals from the random access memories, in which case the predetermined sequence corresponds to the sequence in which the video signal is to be displayed.

However, with such direct interactive control the number of user stations allowed to view a same video signal portion stored in a same random access memory, e.g., a hard disk, and retrieved from the same single output thereof is restricted. Indeed, the throughput at this single output is about equal to 20 Mbit/s and the bitrate of a digitally coded video signal typically amounts to 4 Mbit/s which verifiably restricts the number of user stations simultaneously reading information from the same random access memory to 5. In the "NTSC case" discussed in the above article, this restricts the number of user stations simultaneously viewing one of the 8 portions of 12.5 minutes also to 5 while at most 40 user stations are allowed for the complete video signal.

By proceeding in this way each user station may experience serious flaws in the interactive video on demand service. Indeed, in the given example a sixth user station has a worst case waiting time of 12.5 minutes if 5 other user stations just started viewing the first portion of the video signal, and no user station can fast forward or rewind to a following or previous portion of this video signal stored in another memory already used by 5 other user stations.

DISCLOSURE OF INVENTION

Accordingly, a first object of the invention is to provide a memory management method of the above known type, but by which the above mentioned flaws may be avoided without increasing the number of random access memories.

This object is achieved thanks to the fact that said method further includes the step of storing any two consecutive blocks of said predetermined sequence in distinct ones of said random access memories.

For instance, and taking again the above example of 8 random access memories and of a sequence which corresponds to the normal display sequence at the user station, instead of storing two distinct video signal portions of 12.5 minutes in two distinct random access memories, one may store odd and even numbered blocks, of typically one second or less, of a 25 minutes double signal portion, formed by two consecutive 12.5 minutes video signal portions, alternately in these two distinct memories.

By proceeding in this way a sixth user station now has a worst case waiting time of one block because, after having viewed one block stored in a first of the two distinct memories the first five user stations switch to viewing a following block stored in the second of these memories. This means that the 25 minutes double signal portion can be viewed by exactly the same number of user stations as previously but that within these 25 minutes as much freedom exists for the user stations as previously in the 12.5 minutes portion and hence that the number of user stations able to simultaneously view these 12.5 minutes itself can be doubled.

Also the interactive control is improved since all user stations are allowed to roam freely within a 25 minutes double signal portion instead of within a 12.5 minutes single signal portion. It is to be noted that still none of the user stations can fast forward or rewind over an odd number of blocks since in that case a possible conflict with the 5 user stations reading from the other memory results. However, such a restriction will not be noticed by the user station as a block typically corresponds to one second of the video signal or less as already mentioned above.

Even when it is used to generate a large number of predetermined "phases", a further drawback of the known memory management method remains. Indeed, although the block interleaving scheme and the predetermined sequence in the above article allow an increase of the rate at which these "phases" are generated, the latter rate is still restricted to the maximum sustainable transfer rate of the random access memories, i.e. in the present case to 20 Mbit/s.

However, in using hard disks or other disk shaped memories this maximum sustainable transfer rate is equal to the transfer rate with which data may be retrieved from the inner cylinders of the disk, this rate being much smaller than the rate with which data may be retrieved from the outer cylinders, typically 40 Mbit/s.

Such a limitation has an important adverse affect since it also restricts the number of "phases" which can be generated from a single hard disk and hence the "granularity" with which the video signal can be provided to the user stations in using a predetermined number of hard disks.

A second object of the present invention therefore consists in providing a memory management method of the above known type but allowing the above predetermined sequence to be retrieved at a rate exceeding the above mentioned maximum sustainable transfer rate of the disk shaped random access memories.

This object is achieved thanks to a further feature of the present method which consists in that said plurality of random access memories is constituted by an even number of disk shaped memories each having a plurality of cylinders and is partitioned in equally large first and second subsets of memories, and that said method further includes the step of storing consecutive odd numbered blocks and consecutive even numbered blocks of said sequence in successive cylinders of said first and of said second subset respectively and in first and second directions respectively which are mutually opposite.

In this way, and taking for instance a plurality of two disk shaped memories, the rate at which the predetermined sequence can be generated substantially equals the average of the maximum sustainable transfer rate corresponding to the inner cylinder of the disk shaped memory and the maximum transfer rate of the disk shaped memory corresponding to its outer cylinder. Indeed, in considering the retrieval of any two blocks which are consecutively retrieved according to the predetermined sequence, for instance the one described in the above mentioned article, the first and second of these blocks are retrieved with transfer rates respectively smaller and larger than the above average rate which verifiably leads to a generation rate equalling the above average rate.

A further advantage of this feature is that random access memories may be formatted according to the same memory management method suitable for providing the large number of "phases" as well as the interactive video on demand service. If care is taken that any two consecutive blocks of the video signal correspond to two blocks consecutively retrieved in accordance with the predetermined sequence, this is even the case when this predetermined sequence is arrived at via the above known block interleaving scheme.

A further feature of the present invention is that said plurality of memories comprises a sequence of M consecutively numbered random access memories and said plurality of blocks comprises a sequence of Q consecutively numbered blocks and that each of said blocks with sequence number Y is stored in the random access memory with sequence number equal to Y mod M.

In this way a simple mathematical relation for distributing the blocks over said plurality of random access memories is provided for the cases in which M is larger than two. As may be appreciated from the above discussion of the interactive video on demand service this is advantageous since for instance the complete video signal of 100 minutes of the above examples may then be fully distributed over the 8 available memories, thus allowing 40 user stations to start viewing the video signal almost simultaneously and permitting each of these user stations to fast forward or rewind through the full video signal.

The above relation further not only simplifies the control of the retrieval process when the blocks are stored in more than two random access memories but also ensures that all user stations, after having retrieved a block from one of the random access memories, must retrieve their next block from a same next random access memory so avoiding in a simple way conflicts that might otherwise arise between the retrieval processes of distinct user stations.

Still a further feature of the present invention is that said single outputs of said plurality of random access memories are controlled from a same memory controller via a bus.

Since in so doing, all random access memories over which a same video signal or portion thereof is distributed are controlled by a single memory controller, the present memory management method does not require synchronization as would be necessary when distinct controllers would have to be used.

Yet another feature of the present invention is that said method further includes the step of providing within said video signal a spread mode indicator indicating the number M of said plurality of memories.

As the way in which the video signal or portion thereof is stored in the plurality of random access memories is thus defined within the video signal itself, it can be seen, also taking the mentioned mathematical relation into account, that a reduction of the control signals required to retrieve the video signal is so obtained.

These and other objects, features and advantages of the present invention will become more apparent in light of the detailed description of a best mode embodiment thereof, as illustrated in the accompanying drawing.

BEST MODE FOR CARRYING OUT THE INVENTION

The present video server memory management method is used to store the video signal VS in and retrieve it from the memories of the video server described in detail in the co-pending U.S. patent application having Ser. No. 08/245, 951, claiming priority from European Patent Application 93870085.3 of even date with the parent hereof and entitled "Video server" and described in detail in FIGS. 1–4 thereof at page 9, line 21 through page 22, line 8, all of which is hereby expressly incorporated by reference for background. Also incorporated by reference for background are FIGS. 1–5 and the accompanying text from copending U.S. patent application Ser. No. 08/246,180 beginning at page 8, line 3 through page 17, line 36, which shows a video on demand network in which the present invention may be used.

Before discussing the management method itself the format in which the video signal is stored on such memories is briefly discussed with reference to FIG. 1.

Figure 1:
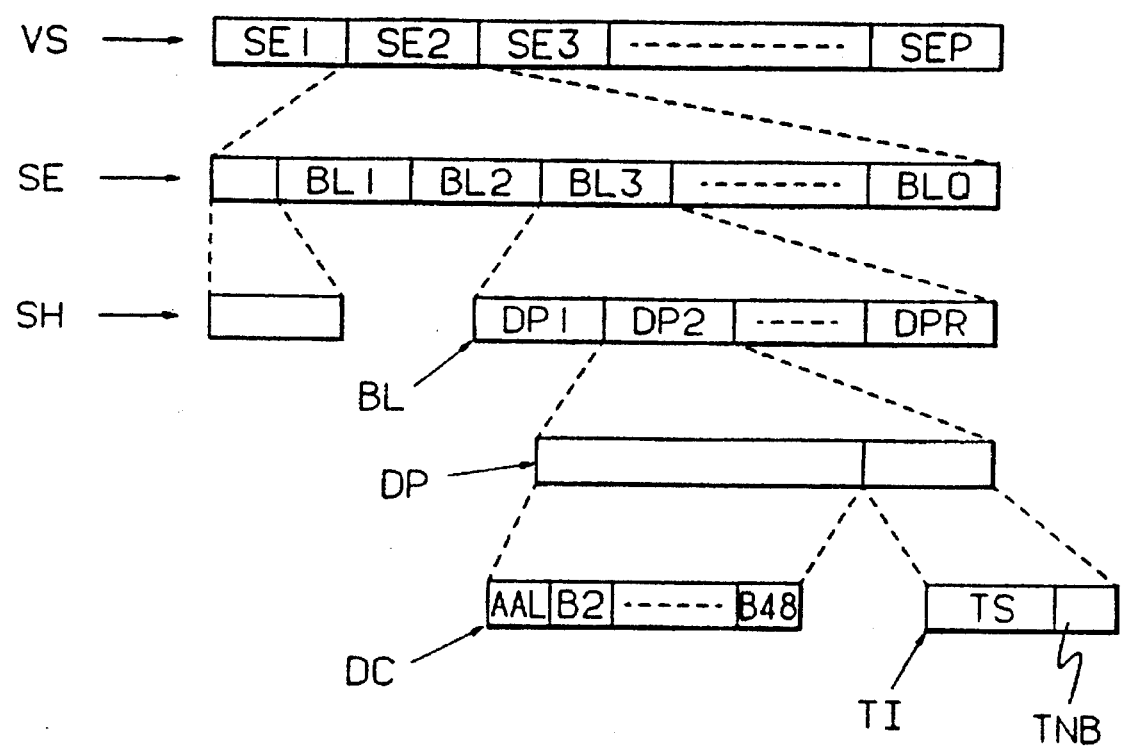
FIG. 1 shows a format in which a video signal VS is stored in memories HD1-4 and HD11-22 represented in FIGS. 2 and 3 respectively.

The digital video signal VS of FIG. 1 is obtained from a so called MPEG bitstream, i.e. a bitstream obtained by applying the coding method proposed by the Moving Pictures Expert Group MPEG and standardized by the International Standards Organisation ISO. This coding method aims at a transmission rate of up to about 1.5 Mbit/s but can also be used for coding rates such as 4 Mbit/s, which can already be achieved with state of the art technology.

To obtain the format shown in FIG. 1, the MPEG-coded bitstream is further coded according to a proprietary code, e.g. a Reed-Solomon code. An ATM Adaptation Layer byte AAL together with each set of 47 consecutive bytes B2-48 of this coded bitstream constitutes the payload DC of a data packet DP which further includes timing information TI consisting of a time stamp TS and a transfer next block bit TNB. A number R of data packets DP1,..., DPR constitute a block BL and a number Q of these blocks BL1, ..., BLQ together with a segment header SH form a segment SE. Finally, a video signal VS consists of a number P of segments SE1,..., SEP, the latter number P being a function of the length of the video signal VS.

As discussed in more detail in the above mentioned co-pending U.S. Patent Application, each segment SE of such a video signal VS is stored within a set of hard disks such as HD1-4 or HD11-22 according to a memory management method described in more detail below. As also discussed in the latter application the video signal VS is retrieved from the hard disks HD1-4/HD11-22 on a block by block basis and each block BL therefore has a length of, e.g., 256 Kbyte, this length being inferior to the size of the cache buffer (not shown) of these hard disks, typically 1 Mbyte.

Figure 2:
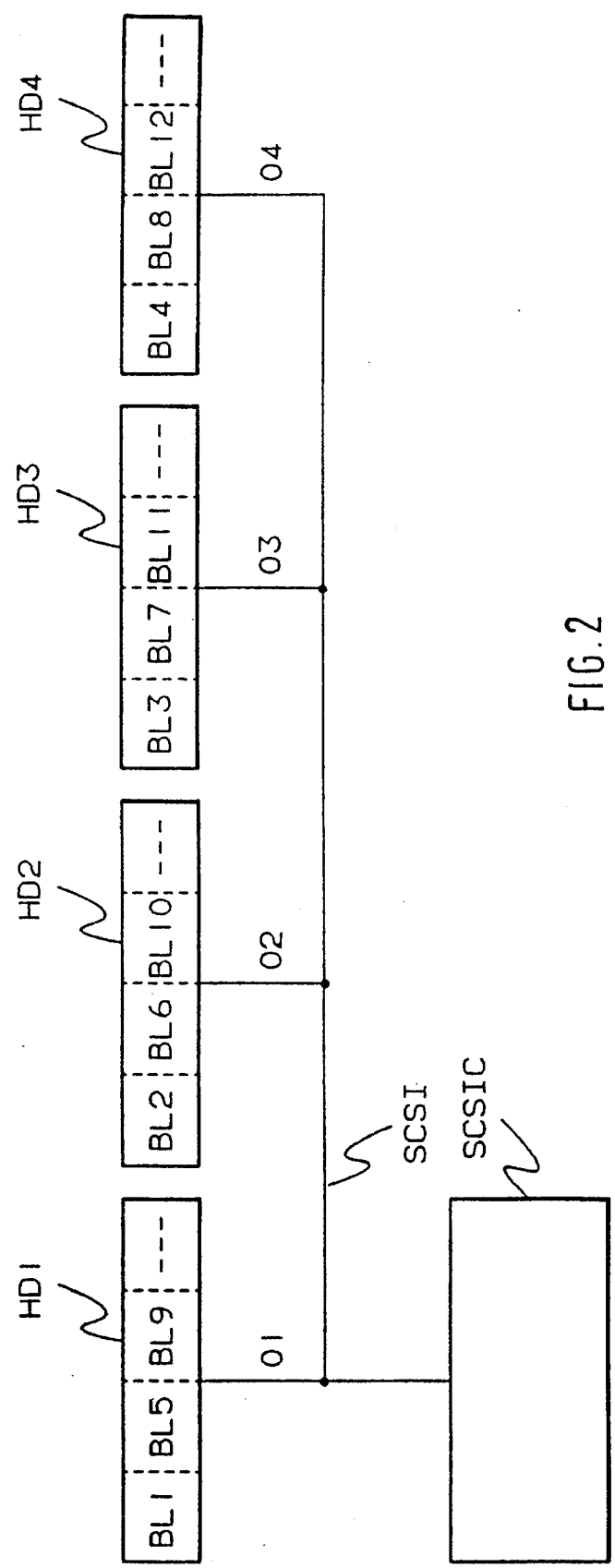
FIG. 2 schematically depicts how, according to the method of the present invention, the video signal VS of FIG. 1 is distributed over the memories HD1-4 having an associated control structure SCSI, SCSIC; and, FIG. 3 schematically depicts how the video signal VS is stored within disk shaped memories HD11-22 according to a feature of the method of the present invention.

FIG. 2 shows such a set of M=4 hard disks HD1-4, each having a respective single output 01-4 via which data stored on the associated disk may be retrieved. These outputs 01-4 are all connected to a bus SCSI according to the well known Small Computer Standard Interface SCSI-2 and this bus SCSI is also connected to an individual memory controller SCSIC specifically designed for controlling memory devices coupled to the bus SCSI and known as such. The latter controller controls the retrieval of data from the hard disks HD1-4 and reacts to commands which are generated in the way described in the above-mentioned U.S. Patent Application. To be noted that maximally 7 hard disks may be connected to a same bus SCSI.

The video server management method then consists in distributing the blocks BL of which BL1-12 of a particular segment SE are shown in FIG. 2 over the M hard disks HD1-4 in the way described hereafter.

First the sequence in which the blocks BL are to be retrieved from the hard disks is considered, this sequence is for the example considered in FIG. 2 the sequence in which these blocks will normally be displayed, i.e., BL1, BL2, BL3, ... The first block BL1 is stored in HD1, the second BL2 in HD2, the third BL3 in HD3, the fourth BL4 in HD4, the fifth BL5 in HD1 and so on until the last block of a segment SE is reached. FIG. 2 shows the result of this method for the twelve blocks BL1-12. It can be easily verified that this storage method corresponds to the formula X=Y MOD M with X the sequence number of one of the M hard disks HD1-4, Y the sequence number of one of the Q blocks BL1-Q of a segment SE, M the number of hard disks over which these blocks BL1-Q are distributed and MOD the modulo operator.

For a particular user station requesting to view the video signal VS this means that the controller SCSIC will alternately connect each of the hard disks HD1-4 to the bus SCSI and so restore the desired retrieval sequence already mentioned above. It is to be noted that SCSIC in retrieving the segment header SH from hard disk HD1 subsequent to the receipt of the appropriate command can itself derive the required sequence of operations needed to retrieve the video signal VS from the hard disks HD1-4. Indeed, this segment header SH includes a spread mode indicator providing the number M and possibly the identities of the hard disks HD1-4 over which the video signal VS is so distributed.

It is to be noted that the same management method can be used to distribute the blocks BL1-Q of a segment SE over distinct parts of a hard disk with multiple parallel heads such as described in the article by W. Sincoskie, each of the parallel heads corresponding to one of the outputs 01-4 and a controller similar to SCSIC being provided within the hard disk itself. It is also to be noted that the method may also be applied My distributing the Q blocks BL1-Q over hard disks such as HD1-4 but coupled to distinct controllers such as SCSIC. In this way the distribution can be made over more than 7 hard disks which allows a possible further service improvement permitting the full video signal VS and not only a portion or segment SE thereof to be stored in the above way. In the latter case the retrieval process of the distinct controllers such as SCSIC involved needs to be synchronized by a control structure as for instance disclosed in the above mentioned U.S. Patent Application.

Figure 3:
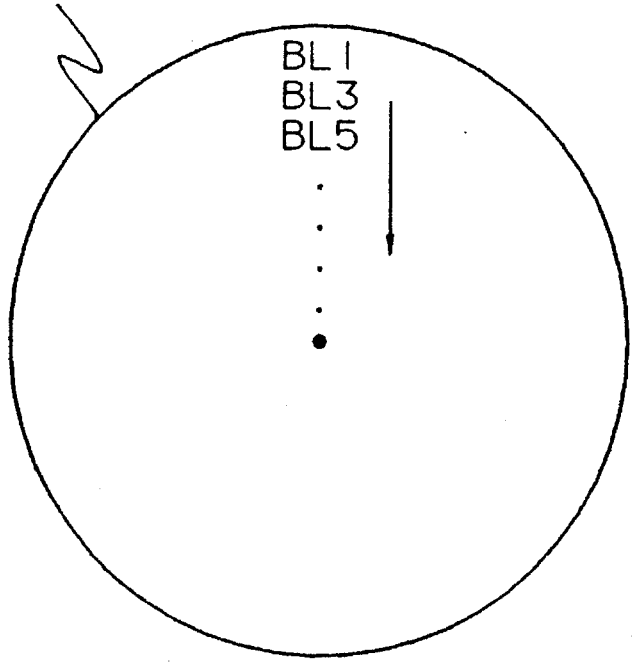
Figure 3:
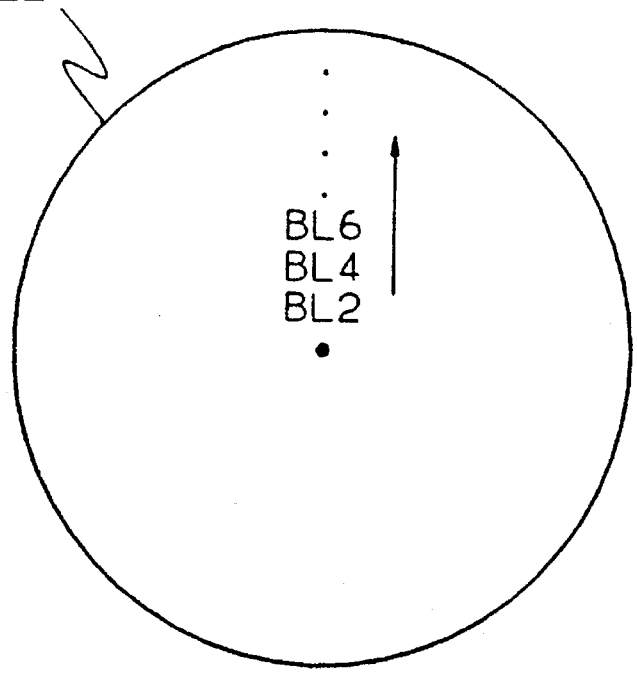

FIG. 3 represents a more detailed way, taking into account the physical structure of the random access memories, of storing the video signal VS on two hard disks HD11-22 and more particularly of storing the blocks BL1-Q of the video signal VS in specific memory locations of these two disks. This feature allows an increase in the retrieval rate of the video signal VS in case a user station cannot modify the sequence with which the Q blocks BL1-Q are retrieved.

More particularly, FIG. 3 shematically represents the memory locations on the surfaces of the two hard disks HD11-22 wherein the blocks BL1-6 are stored, as well as well as an arrow for each disk HD11-22 indicating the direction in which consecutive further blocks of the sequence are to be stored. The hard disks HD11-22 are characterized by a maximum sustainable transfer rate of 20 Mbit/sec corresponding to the transfer rate of the innermost cylinder, i.e. the cylinder closest to the centre of the disk. For intermediate cylinders the transfer rate increases in a substantially linear way to reach the maximum transfer rate of the disk corresponding to the transfer rate of 40 Mbit/s of the outermost cylinder, i.e. of the cylinder closest to the edge of the disk.

In accordance with the above basic characteristics of the present memory management method the odd numbered blocks BL1, BL3, BL5, ... are stored in successive cylinders of hard disk HD11 whilst the even numbered blocks BL2, BL4, BL6, ... are stored in successive cylinders of hard disk HD22. More particularly and as shown in FIG. 3, BL1 is stored in the outermost cylinder of HD11 while the further blocks BL3, BL5, ... are stored in cylinders indicated by the arrow which are closer and closer to the centre of the hard disk HD11 until eventually a last block of the above series of odd blocks is stored in the innermost cylinder of HD11. On the contrary, in HD22 the first block BL2 of the sequence BL2, BL4, BL6, ... is stored in the innermost cylinder while further even numbered blocks BL4, BL6, ... are stored on cylinders as indicated by the arrow, i.e., progressively closer to the peripheral edge of the hard disk HD22 until in this case the last block of this series is stored in the outermost cylinder of HD22.

When defining the middle cylinder of hard disks such as HD11-22, as the cylinder having a diameter which is the average of the diameters of the inner- and outermost cylinders and when these blocks BL1-Q are retrieved in sequence from the hard disks HD11-22, a controller such as SCSIC alternately retrieves a block with relatively high transfer rate, i.e., higher than the average transfer rate provided by the middle cylinder, and a block with relatively low transfer rate, i.e., lower than the above average rate. It can then be seen that the average sustainable transfer rate in retrieving the blocks from the hard disks HDA11 and HDA22 is substantially equal to the mentioned average rate which in the present example is 30 Mbit/s.

It is to be noted that the example shown in FIG. 3 only serves to show the principle of the memory management method as normally each hard disk comprises a plurality, i.e. typically 10 to 20, surfaces on which data may be stored and that each cylinder, certainly if this cylinder comprises a plurality of tracks on distinct surfaces, may be used to store a large number of distinct blocks BL with a length of 256 Kbyte. The application of the principle shown in FIG. 1 to a hard disk with a more realistic structure is however straightforward and well within the capabilities of a person skilled in the art and is therefore not discussed in any more detail here. Furthermore, the numerical values given above are also applicable to such more realistic structures for the hard disks HD11-22.

Finally, for the application of the latter memory management method to produce predetermined sequences over which the user stations have no control, it is important to note that these predetermined sequences may deviate from the above sequence corresponding to the sequence in which the blocks are displayed.

More particularly, the sequence which corresponds to the block interleaving scheme discussed in the mentioned article by W. Sincoskie may be used. This sequence allows a large number of so called "phases" to be produced at a high retrieval rate as the hard disk may be read in a continuous way so avoiding a reduction of the retrieval rate due to the repeated repositioning of the read head of the hard disks. It is to be noted in this respect that the present video server memory management method allows to produce 1.5 times as many "phases" per hard disk HD11-22 thanks to the above described increase in the sustainable transfer rate since the number of "phases" with the known method has to be dimensioned for the the maximum sustainable transfer rate or the transfer rate of the innermost cylinders which is only 20 Mbit/s.

While the principles of the invention have been described above in connection with specific apparatus, it is to be clearly understood that this description is made only by way of example and not as a limitation on the scope of the invention. Similarly although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. Video server memory management method comprising the steps of providing a memory constituted by a plurality of random access memories each having a single output for retrieving a video signal stored therein, subdividing said video signal into a plurality of distinct blocks corresponding to successive parts of said video signal in a predetermined sequence, storing any two consecutive blocks of said predetermined sequence in different ones of said random access memories with at least two of said blocks in each of said random access memories and, retrieving said blocks from said random access memories in said predetermined sequence for displaying the video signal, wherein said plurality of memories comprises a sequence of M consecutively numbered random access memories, wherein said method further comprises the step of providing within said video signal a spread mode indicator indicating the number M of said plurality of memories, wherein said plurality of blocks comprises a sequence of Q consecutively numbered blocks, and wherein each of said consecutively numbered blocks with a sequence number Y is stored in the random access memory with a sequence number equal to Y modulo M.

2. Video server memory management method according to claim 1, wherein said plurality of M random access memories comprises an even number of disk memories each having a center and an edge, each having a plurality of cylinders and partitioned in equally large first and second subsets of memories, and wherein said method further comprises the step of storing consecutive odd numbered blocks and consecutive even numbered blocks of said sequence in successive cylinders of said first and of said second subset, respectively, and in first and second directions, respectively, which directions are mutually opposite and which are directed between the center and the edge of each of the disk memories whereby a transfer rate of said video signal is increased.

\* \* \* \* \*